United States Patent
Kang et al.

(10) Patent No.: US 11,611,362 B2
(45) Date of Patent: Mar. 21, 2023

(54) DUOBINARY RECEIVER FOR RECEIVING A DUOBINARY SIGNAL

(71) Applicants: SK hynix Inc., Icheon (KR); RESEARCH & BUSINESS FOUNDATION SUNGKYUNKWAN UNIVERSITY, Suwon (KR)

(72) Inventors: Dongsuk Kang, Suwon (KR); Jaewoo Park, Incheon (KR); Jung-Hoon Chun, Suwon (KR); Kyu Dong Hwang, Icheon (KR); Dae Han Kwon, Icheon (KR)

(73) Assignees: SK hynix Inc., Icheon (KR); RESEARCH & BUSINESS FOUNDATION SUNGKYUNKWAN UNIVERSITY, Suwon (KR)

( * ) Notice: Subject to any disclaimer, the term of this patent is extended or adjusted under 35 U.S.C. 154(b) by 0 days.

(21) Appl. No.: 17/412,141

(22) Filed: Aug. 25, 2021

(65) Prior Publication Data

US 2022/0166451 A1     May 26, 2022

(30) Foreign Application Priority Data

Nov. 23, 2020    (KR) .................. 10-2020-0158027

(51) Int. Cl.
*H04B 1/16*    (2006.01)
*H03K 5/24*    (2006.01)
*H03K 19/20*   (2006.01)

(52) U.S. Cl.
CPC ............... *H04B 1/16* (2013.01); *H03K 5/249* (2013.01); *H03K 19/20* (2013.01)

(58) Field of Classification Search
CPC ........................................................ H04B 1/16
USPC ........................................................ 375/316
See application file for complete search history.

(56) References Cited

U.S. PATENT DOCUMENTS

| 6,246,731 B1 * | 6/2001 | Brianti | G11B 20/10009 |
| | | | 375/341 |
| 2005/0074076 A1 * | 4/2005 | Chen | H04L 25/063 |
| | | | 375/317 |
| 2020/0007362 A1 | 1/2020 | Kim et al. | |
| 2020/0293080 A1 * | 9/2020 | Poon | H03K 5/1565 |

FOREIGN PATENT DOCUMENTS

KR   10-2020-0041424 A    4/2020

\* cited by examiner

*Primary Examiner* — Lihong Yu

(57) ABSTRACT

A duobinary receiver includes a signal dividing circuit configured to output a plurality of data by dividing an input signal according to a plurality of multi-phase sampling clocks signals; a level detecting circuit configured to output a plurality of state signals respectively corresponding to duobinary levels of the plurality of data; and a data converting circuit configured to decode the plurality of state signals to output a corresponding plurality of bits.

10 Claims, 10 Drawing Sheets

<Prior Art>

FIG. 9

| DS1 | ST01 | ST11 | Duobinary Level | NRZ1 |
|---|---|---|---|---|
| < VL | 0 | 0 | 0 | 0 |
| > VL, < VH | 0 | 1 | 1 | /PNRZ4 |
| > VL, < VH | 1 | 0 | 1 | /PNRZ4 |
| > VH | 1 | 1 | 2 | 1 |

DUOBINARY RECEIVER FOR RECEIVING A DUOBINARY SIGNAL

CROSS-REFERENCE TO RELATED APPLICATION

The present application claims priority under 35 U.S.C. § 119(a) to Korean Patent Application No. 10-2020-0158027, filed on Nov. 23, 2020, which is incorporated herein by reference in its entirety.

BACKGROUND

1. Technical Field

Various embodiments generally relate to a duobinary receiver for receiving a duobinary signal.

2. Related Art

FIG. 1 illustrates a conventional duobinary receiver for receiving a duobinary signal.

The conventional duobinary receiver includes an analog receiving circuit 10 for receiving a signal input through a channel and a duobinary conversion circuit 20 decoding a duobinary signal using an input signal DIN output from the analog receiving circuit 10.

The duobinary conversion circuit 20 includes two comparators 21 and 22 operating according to an even clock signal CKE and two comparators 23 and 24 operating according to an odd clock signal CKO.

At this time, each comparator compares a first reference voltage VH or a second reference voltage VL with the input signal DIN.

As described above, in the conventional duobinary receiver, a total of four comparators must always be coupled to an output terminal of the analog receiving circuit 10, and more comparators can be coupled when an equalization operation is performed.

When many comparators are coupled to the output terminal of the analog receiving circuit 10 all the time, a load on the output terminal increases and power consumption increases during operation of the duobinary receiver.

SUMMARY

In accordance with an embodiment of the present disclosure, a duobinary receiver may include a signal dividing circuit configured to output a plurality of data by dividing an input signal according to a plurality of multi-phase sampling clocks signals; a level detecting circuit configured to output a plurality of state signals respectively corresponding to duobinary levels of the plurality of data; and a data converting circuit configured to decode the plurality of state signals to output a corresponding plurality of bits.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

FIG. 9 illustrates a table showing operation of a first data converting subcircuit according to an embodiment of the present disclosure.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of teachings of the present disclosure. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 1:
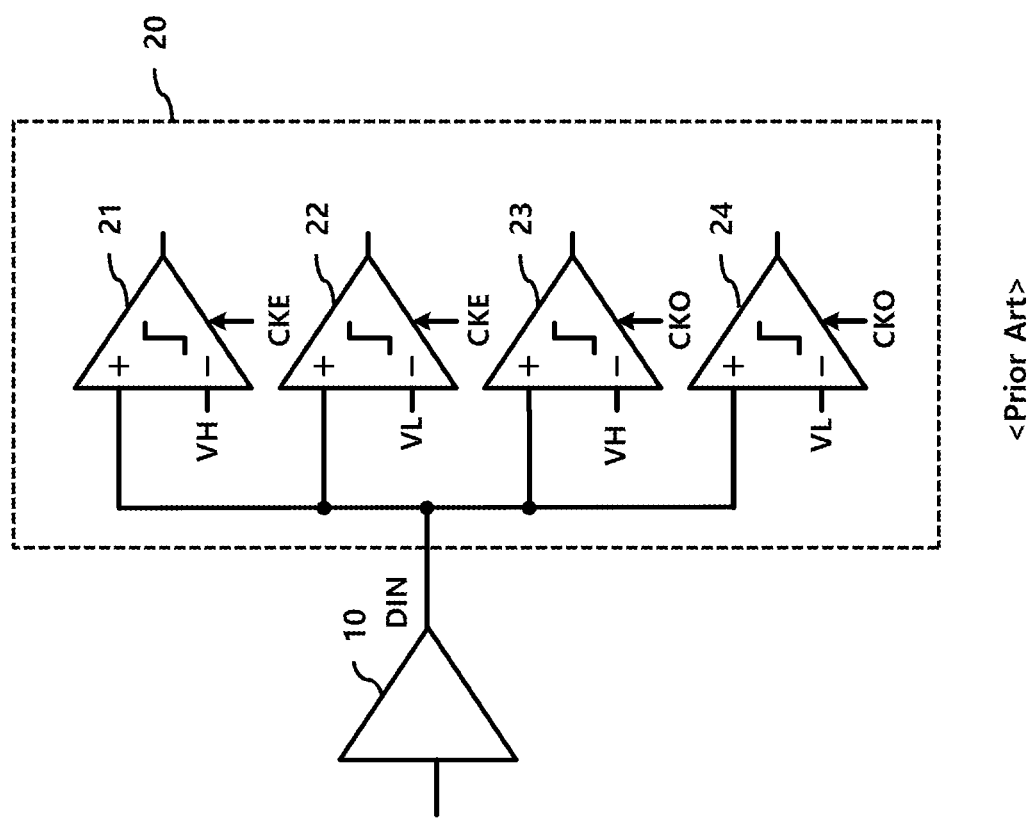
FIG. 1 illustrates a conventional duobinary receiver.
Figure 2:
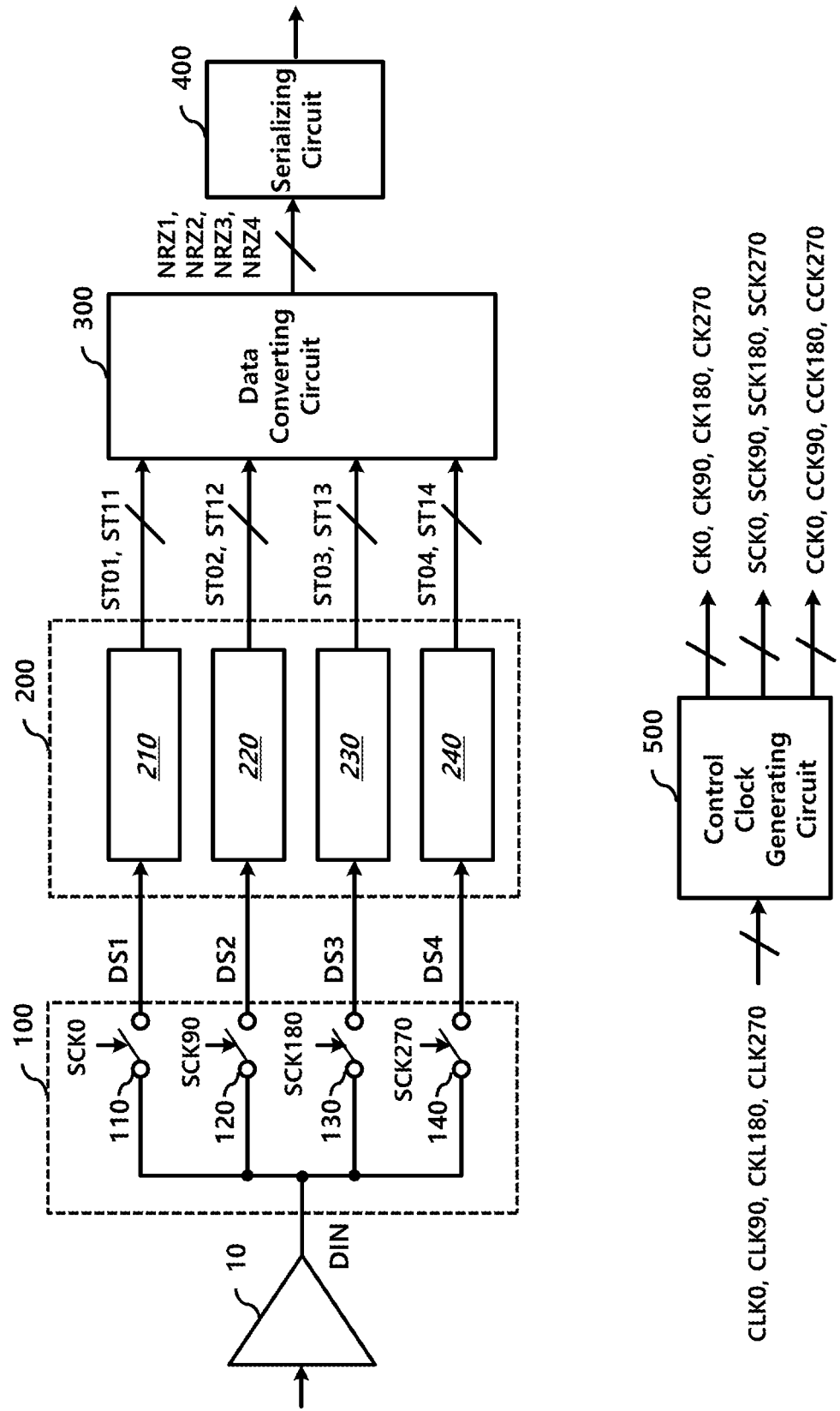
FIG. 2 illustrates a duobinary receiver according to an embodiment of the present disclosure.

FIG. 2 illustrates a duobinary receiver according to an embodiment of the present disclosure.

In this embodiment, the duobinary receiver includes an analog receiving circuit 10, a signal dividing circuit 100, a level detecting circuit 200, a data converting circuit 300, a serializing circuit 400, and a control clock generating circuit 500.

The analog receiving circuit 10 receives a signal transmitted from a channel and outputs an input signal DIN.

The analog receiving circuit 10 may include an equalizer such as a continuous time linear equalizer (CTLE) and an amplifier. Since the analog receiving circuit 10 is well-known in the related arts, a detailed description thereof will be omitted.

The signal dividing circuit 100 divides the input signal DIN using a plurality of multiphase sampling clock signals and outputs the divided signals.

In this embodiment, the signal dividing circuit 100 includes a first switch 110, a second switch 120, a third switch 130, and a fourth switch 140.

The first switch 110 outputs the input signal DIN as a first data signal DS1 while a first sampling clock signal SCK0 among the plurality of multiphase sampling clock signals is activated.

The second switch 120 outputs the input signal DIN as a second data signal DS2 while a second sampling clock signal SCK90 among the plurality of multiphase sampling clock signals is activated.

The third switch 130 outputs the input signal DIN as a third data signal DS3 while a third sampling clock signal SCK180 among the plurality of multiphase sampling clock signals is activated.

The fourth switch 140 outputs the input signal DIN as a fourth data signal DS4 while a fourth sampling clock signal SCK270 among the plurality of multiphase sampling clock signals is activated.

The first to fourth sampling clock signals SCK0 to SCK270 are four-phase clock signals generated by the control clock generating circuit 500.

The control clock generating circuit 500 generates four-phase clock signals CK0, CK90, CK180, and CK270, four-phase sampling clock signals SCK0, SCK90, SCK180, and SCK270, and four-phase comparing clock signals CCK0, CCK90, CCK180, and CCK270 are generated from four-phase input clock signals CLK0, CLK90, CLK180, and CLK270 corresponding to an input clock signal CLK. The four-phase input clock signals CLK0, CLK90, CLK180, and CLK270 respectively correspond to phase shifts of 0, 90, 180, and 270 degrees.

The input clock signal CLK may be a signal transmitted from a transmitter through a channel, or a signal restored in the duobinary receiver.

Duty ratios of the four-phase input clock signals CLK0, CLK90, CLK180, and CLK270 corresponding to the input clock signal CLK may be adjusted. In an embodiment, the duty ratios of each of the four-phase input clock signals CLK0, CLK90, CLK180, and CLK270 are about 50%.

Figure 3:
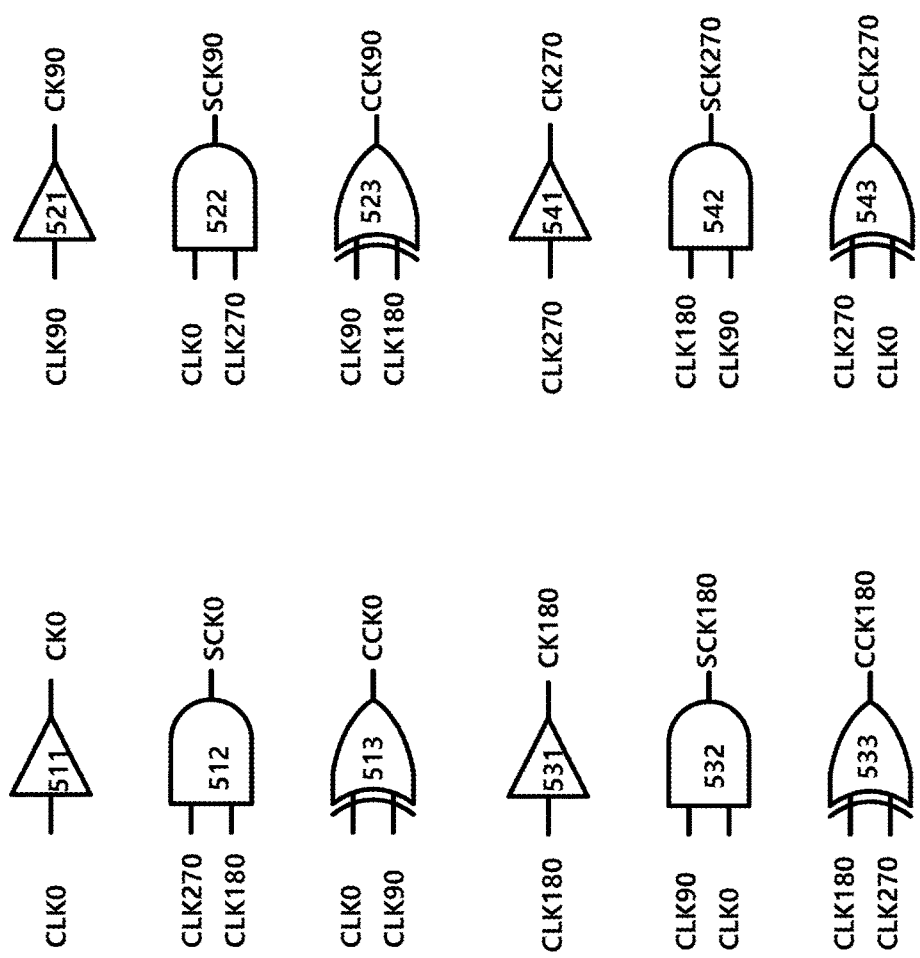
FIG. 3 illustrates a control clock generating circuit according to an embodiment of the present disclosure.

FIG. 3 illustrates the control clock generating circuit 500.

The control clock signal generating circuit 500 includes a plurality of buffers 511, 521, 531, and 541, a plurality of AND gates 512, 522, 532, and 542, and a plurality of XOR gates 531, 532, 533, and 543.

The buffer 511 buffers the first input clock signal CLK0 and outputs the first clock signal CK0.

The AND gate 512 performs an AND operation on the fourth input clock signal CLK270 and the third input clock signal CLK180 to output the first sampling clock signal SCK0.

The XOR gate 513 outputs a first comparing clock signal CCK0 by performing an XOR operation on the first input clock signal CLK0 and the second input clock signal CLK90.

The delay amounts of the buffer 511, the AND gate 512, and the XOR gate 513 are set to be substantially the same.

Figure 7:
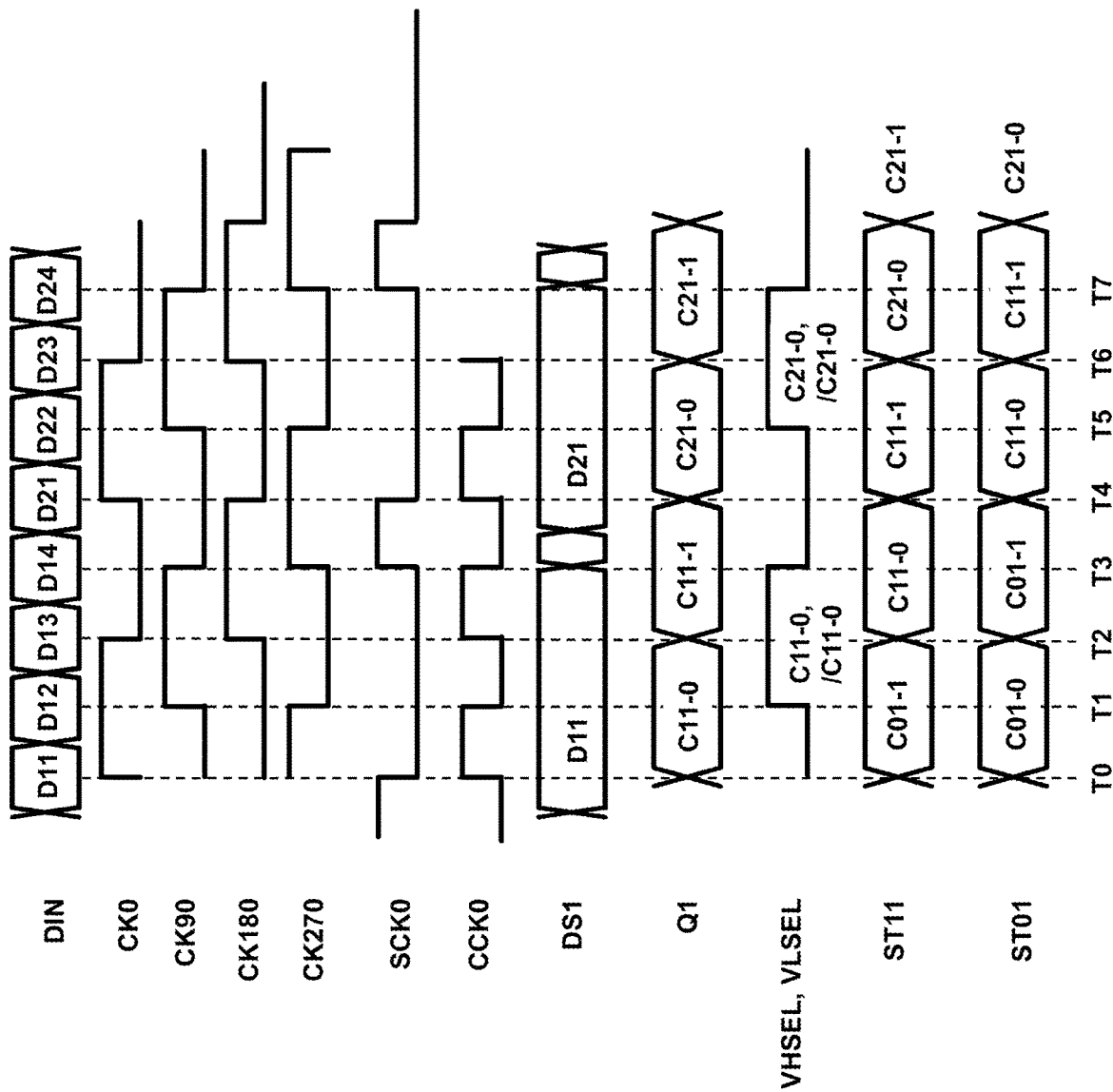
FIG. 7 illustrates a timing diagram showing an operation of the first level detecting subcircuit according to an embodiment of the present disclosure.

Accordingly, as shown in FIG. 7, a rising edge of the first sampling clock signal SCK0 is aligned with a rising edge of the second clock signal CK90, and a falling edge of the first sampling clock signal SCK0 is aligned with a rising edge of the third clock signal CK180.

Also, a rising edge of the first comparing clock signal CCK0 is aligned with a rising edge or a falling edge of the first clock signal CK0, and a falling edge of the first comparing clock signal CCK0 is aligned with a rising edge or a falling edge of the second clock signal CK90. Accordingly, the frequency of the first comparing clock signal CCK0 is twice the frequency of the first sampling clock signal SCK0.

Operations of the remaining buffers, AND gates, and XOR gates are substantially the same as those described above except for corresponding signals, and thus description thereof will be omitted in the interest of brevity. Accordingly, rising and falling edge of the second sampling clock signal SCK90 are respectively aligned with a rising edge of the third clock signal CK180 and a rising edge of the fourth clock signal CK270; rising and falling edge of the third sampling clock signal SCK180 are respectively aligned with a rising edge of the fourth clock signal CK270 and a rising edge of the first clock signal CK0; and rising and falling edge of the fourth sampling clock signal SCK270 are respectively aligned with a rising edge of the first clock signal CK0 and a rising edge of the second clock signal CK90. Furthermore, rising and falling edges of the second comparing clock signal CCK90 are respectively aligned with rising and falling edges of the second clock signal CK90 and rising and falling edges of the third clock signal CK180; rising and falling edges of the third comparing clock signal CCK180 are respectively aligned with rising and falling edges of the third clock signal CK180 and rising and falling edges of the fourth clock signal CK270; and rising and falling edges of the fourth comparing clock signal CCK270 are respectively aligned with rising and falling edges of the fourth clock signal CK270 and rising and falling edges of the first clock signal CK0. Furthermore, the second, third, and fourth comparing clock signals CCK90, CCK180, and CCK270 operate at twice the frequency of the second, third, and fourth sampling clock signals SCK90, SCK180, and SCK270.

Returning to FIG. 2, the level detecting circuit 200 includes first to fourth level detecting subcircuits 210, 220, 230, and 240.

The first level detecting subcircuit 210 detects a level of a first data signal DS1 and outputs first state signal ST01 and ST11. In the first state signal, ST01 corresponds to a most significant bit of the first state signal, and ST11 corresponds to a least significant bit of the first state signal.

The second level detecting subcircuit 220 detects a level of a second data signal DS2 and outputs second state signal ST02 and ST12.

The third level detecting subcircuit 230 detects a level of the third data signal DS3 and outputs third state signal ST03 and ST13.

The fourth level detecting subcircuit 240 detects a level of the fourth data signal DS4 and outputs fourth state signal ST04 and ST14.

The configurations of the first, second, third, and fourth level detecting subcircuits 210, 220, 230, and 240 are substantially the same. Hereinafter, the configuration of the first level detecting subcircuit 210 will be described in detail.

Figure 4:
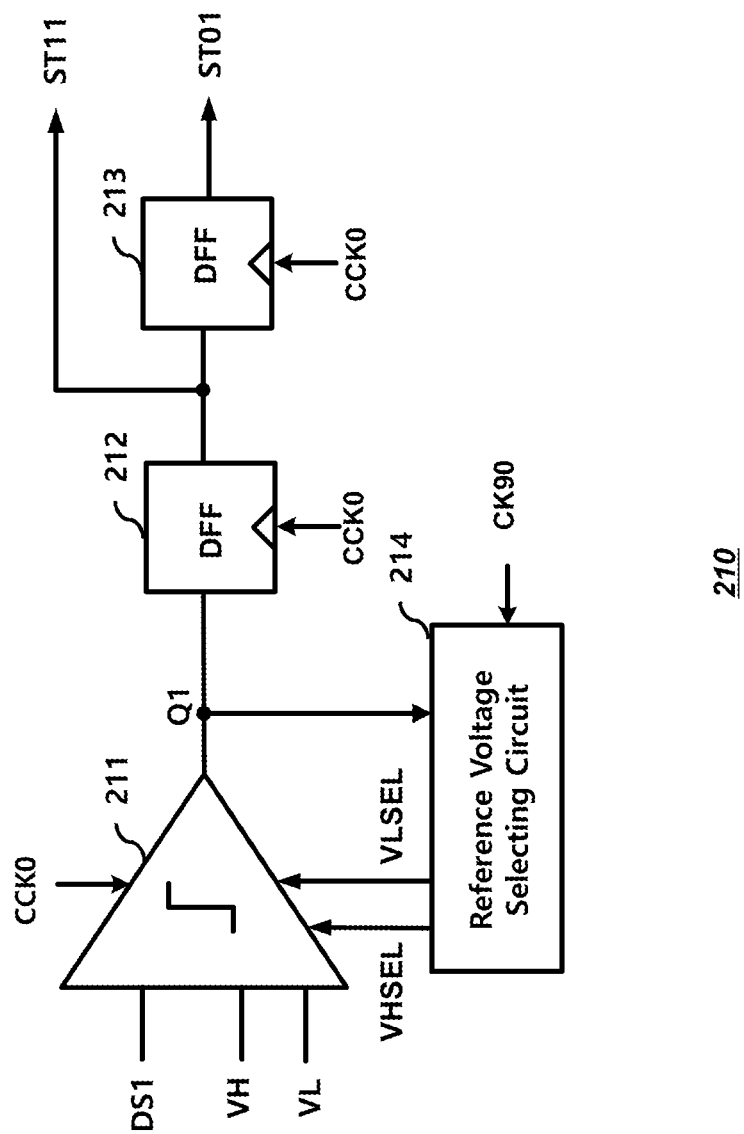
FIG. 4 illustrates a first level detecting subcircuit according to an embodiment of the present disclosure.

FIG. 4 illustrates the first level detecting subcircuit 210.

The first level detecting subcircuit 210 includes a comparing circuit 211, flip-flops 212 and 213, and a reference voltage selection circuit 214.

The comparing circuit 211 as controlled by the reference voltage selection circuit 214 compares a sample of the first data signal DS1 with an intermediate voltage VZ to produce a first result on the comparison signal Q1, and then compares the sample to either the first reference voltage VH or the second reference voltage VL, as determined according to the first result, to produce a second result on the comparison signal Q1.

In this embodiment, the intermediate voltage VZ is an average voltage of a first power supply voltage VDD and a second power supply voltage VSS, the first reference voltage VH corresponds to an average of the first power supply voltage VDD and the intermediate voltage VZ, and the second reference voltage VL corresponds to an average of the second power supply voltage VSS and the intermediate voltage VZ. However, embodiments are not limited thereto, and other voltages may be used as long as the intermediate voltage VZ is between the first reference voltage VH and second reference voltage VL.

In this embodiment, the comparing circuit 211 operates in synchronization with the first comparing clock signal CCK0.

The flip-flop 212 latches the comparison signal Q1 according to the first comparing clock signal CCK0 to output the least significant bit ST11 of the first state signal, and the flip-flop 213 latches an output of the flip-flop 212 according to the first comparing clock signals CK0 to output the most significant bit ST01 of the first state signal. Because the most significant bit ST01 corresponds to the first result produced on the comparison signal Q1 and the least significant bit ST11 corresponds to the second result produced on the comparison signal Q1, the flip-flops 212 and 213 operate to parallelize ST01 and ST11 of the first state signal so that they are output at a same time.

The reference voltage selection circuit 214 outputs the first selection signal VHSEL and the second selection signal VLSEL according to the comparison signal Q1 and the second clock signal CK90.

Figure 5:
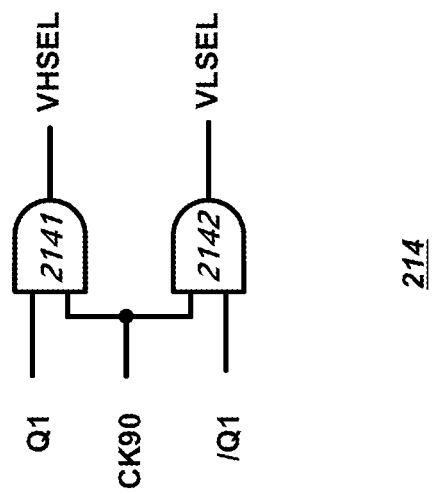
FIG. 5 illustrates a reference voltage selecting circuit according to an embodiment of the present disclosure.

FIG. 5 is a circuit diagram showing the reference voltage selecting circuit 214.

The reference voltage selecting circuit 214 includes AND gates 2141 and 2142.

The AND gate 2141 performs an AND operation on the comparison signal Q1 and the second clock signal CK90 to output the first selection signal VHSEL.

The AND gate 2142 performs an AND operation on an inverted comparison signal /Q1 and the second clock signal CK90 to output the second selection signal VLSEL.

Accordingly, when the second clock signal CK90 is at a low level, both the first selection signal VHSEL and the second selection signal VLSEL are at the low level. As a result, when the second clock signal CK90 is at a low level, the reference voltage selecting circuit 214 controls the comparing circuit 211 to produce the first result by comparing the first data signal DS1 to the intermediate voltage VZ, and when the second clock signal CK90 is at a high level, the reference voltage selection circuit 214 controls the comparing circuit 211 to produce the second result by comparing first data signal DS1 to the first reference voltage VH when the first result indicates (by being '1') that the first data signal DS1 has a voltage value greater than the intermediate voltage VZ, and to the second reference voltage VL when the first result indicates (by being '0') that the first data signal DS1 has a voltage value less than the intermediate voltage VZ.

Figure 6:
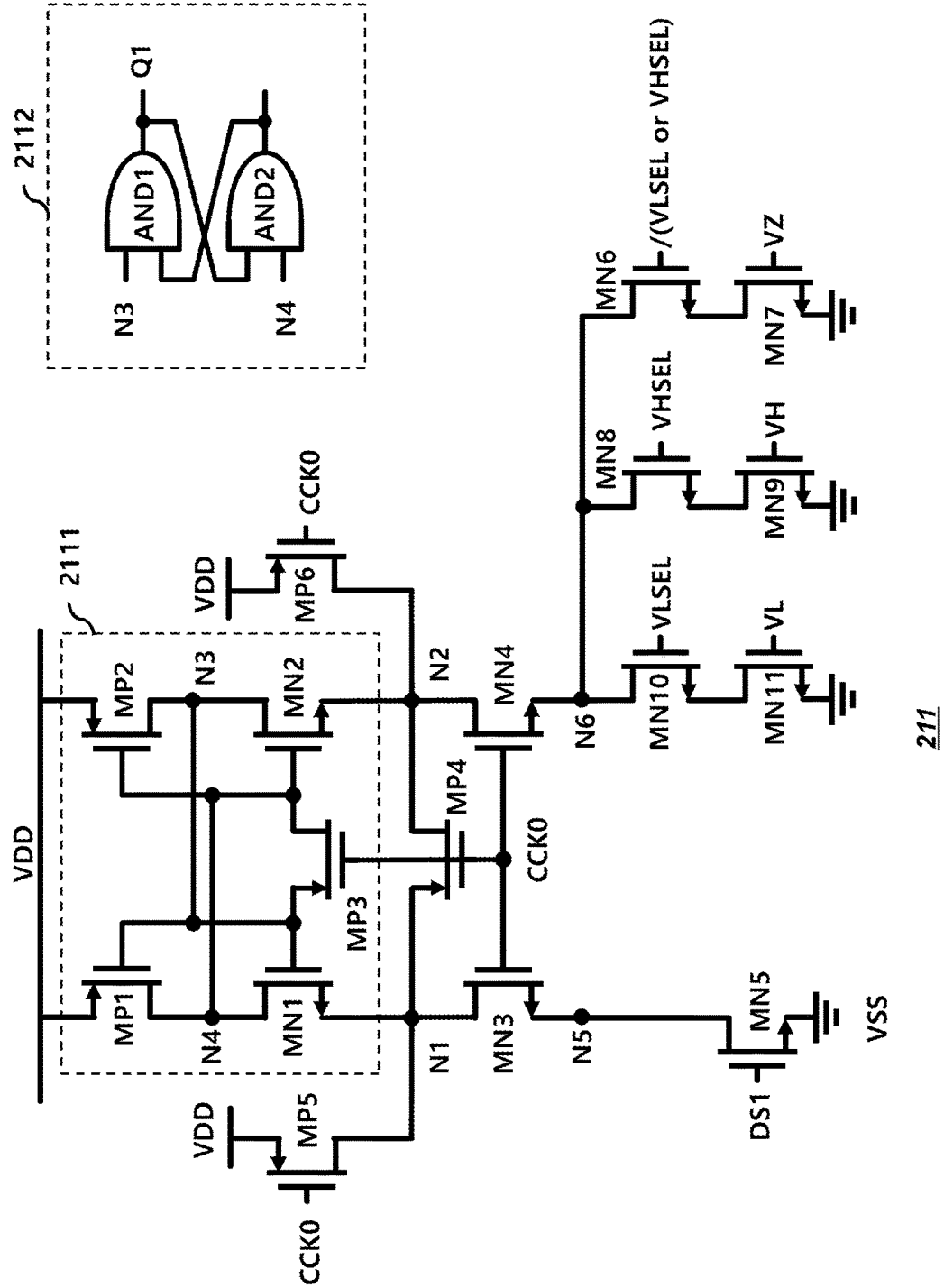
FIG. 6 illustrates a comparing circuit according to an embodiment of the present disclosure.

FIG. 6 is a circuit diagram showing the comparing circuit 211.

The comparing circuit 211 includes a cross-coupled circuit 2111.

The cross-coupled circuit 2111 includes a PMOS transistor MP1 and an NMOS transistor MN1 that are coupled between a first power source VDD and a first node N1 to form an inverter, and a PMOS transistor MP2 and an NMOS transistor MN2 that are coupled between a first power source VDD and a second node N2 to form an inverter.

Gates of the PMOS transistor MP1 and the NMOS transistor MN1 are coupled to the third node N3, and drains of the PMOS transistor MP1 and the NMOS transistor MN1 are coupled to the fourth node N4.

Also, gates of the PMOS transistor MP2 and the NMOS transistor MN2 are coupled to the fourth node N4, and drains of the PMOS transistor MP2 and the NMOS transistor MN2 are coupled to the third node N3.

The cross-coupled circuit 2111 further includes a PMOS transistor MP3 coupling the third node N3 and the fourth node N4 when the first comparing clock signal CCK0 is at the low level.

The comparing circuit 211 further includes a PMOS transistor MP4 coupling the first node N1 and the second node N2 when the first comparing clock signal CCK0 is at the low level.

The comparing circuit 211 further includes a PMOS transistor MP5 coupling the first node N1 and the first power source VDD and a PMOS transistor MP6 coupling the second node N2 and the first power source VDD when the first comparing clock signal CCK0 is at the low level.

The comparing circuit 211 further includes an NMOS transistor MN3 connecting the first node N1 and the fifth node N5 and an NMOS transistor MN4 coupling the second node N2 and the sixth node N6 when the first comparing clock signal CCK0 is at a high level.

The comparing circuit 211 further includes an NMOS transistor MN5 having a gate receiving the first data signal DS1 and a drain and a source coupled between the fifth node N5 and the second power source VSS.

The comparing circuit 211 includes NMOS transistors MN6 and MN7 sequentially coupled between the sixth node N6 and the second power source VSS.

An intermediate voltage VZ is applied to a gate of the NMOS transistor MN7.

The NMOS transistor MN6 is turned on when both the first selection signal VHSEL and the second selection signal VLSEL are at the low level. Accordingly, in an embodiment, a gate of the NMOS transistor MN6 may be coupled to an output of a two-input NOR gate (not shown) having inputs respectively coupled to the first and second selection signals VHSEL and VLSEL.

The comparing circuit 211 includes NMOS transistors MN8 and MN9 sequentially coupled between the sixth node N6 and the second power source VSS.

A first reference voltage VH is applied to the gate of the NMOS transistor MN9.

The NMOS transistor MN8 is turned on when the first selection signal VHSEL is at a high level.

The comparing circuit 211 includes NMOS transistors MN10 and MN11 sequentially coupled between the sixth node N6 and the second power source VSS.

A second reference voltage VL is applied to the gate of the NMOS transistor MN11.

The NMOS transistor MN10 is turned on when the second selection signal VLSEL is at the high level.

The comparing circuit 211 further includes a latch circuit 2112.

The latch circuit 2112 is an RS type latch circuit including cross-coupled AND gates AND1 and AND2.

One of the two input terminals of the AND gate AND1 is coupled to the third node N3, and one of the two input terminals of the AND gate AND2 is coupled to the fourth node N4.

The comparison signal Q1 is output from the AND gate AND1.

When the first comparing clock signal CCK0 is at the high level, voltages of the third node N3 and the fourth node N4 are amplified to different levels according to difference between current flowing from the fifth node N5 to the second power source VSS and current flowing from the sixth node N6 to the second power source VSS.

A case in which the NMOS transistor MN6 is turned on will be described as an example.

When the voltage of the first data signal DS1 is higher than the intermediate voltage VZ, the current flowing through the fifth node N5 is greater than a current flowing through the sixth node N6 and the voltage of the fourth node N4 precharged with the first power voltage VDD falls faster than the voltage of the third node N3.

Thereafter, the voltage of the third node N3 is amplified to the high level and the voltage of the fourth node N4 is amplified to the low level by an operation of the cross-coupled circuit 2111.

Accordingly, the comparison signal Q1 becomes the high level by the operation of the latch circuit 2112.

Afterwards, when the first comparing clock signal CCK0 becomes the low level, the third node N3 and the fourth node N4 are precharged to the first power voltage VDD, so that the comparison signal keeps its original value by the operation of the latch circuit 2112.

FIG. 7 is a timing diagram illustrating an operation of the first level detecting subcircuit 210.

The first switch 110 of the signal dividing circuit 100 outputs the input signal DIN as the first data signal DS1 in synchronization with the first sampling clock signal SCK0.

For example, in a period between T3 and T4 in which the first sampling clock signal SCK0 is at the high level, a value of D14 and a value D21 of the input signals DIN are sequentially output.

In this case, the data values D11 to D14 and D21 to D24 of the input signal DIN are analog values corresponding to respective phases of the clock signal CK.

In the period in which the first sampling clock signal SCK0 is at the low level, the first switch 110 is turned off and the last transmitted signal is maintained.

Accordingly, in the period between T4 and T7, the value D21 of the input signal DIN is maintained on the first data signal DS1. In the same way, in the period between T0 and T3, the value D11 of the input signal DIN is maintained on the first data signal DS1.

As described above, the comparing circuit 211 operates in synchronization with the first comparing clock signal CCK0.

First, in the period between T0 and T1, since both the first selection signal VHSEL and the second selection signal VLSEL are at the low level, the NMOS transistor MN6 is turned on and the NMOS transistors MN8 and MN10 are turned off in FIG. 6.

Accordingly, the comparing circuit 211 outputs a comparison signal Q1 that is a result of comparing the first data signal DS1 with the intermediate voltage VZ. At this time, the value of the comparison signal Q1 is denoted as C11-0, which indicates whether the value D11 of the first data signal DS1 was above the intermediate voltage VZ.

In a period in which the second clock signal CK90 is at the low level, both the first selection signal VHSEL and the second selection signal VLSEL are at the low level.

In a period between T1 and T3 in which the second clock signal CK90 is at the high level, the value of the first selection signal VHSEL corresponds to C11-0 and the value of the second selection signal VLSEL corresponds to /C11-0.

When the first comparing clock signal CCK0 again reaches the high level at T2, the NMOS transistor MN8 or the NMOS transistor MN10 is turned on according to the C11-0 value.

For example, when the value C11-0 corresponds to the high level, the NMOS transistor MN8 is turned on and the NMOS transistors MN6 and MN10 are turned off in FIG. 6. In this case, the comparing circuit 211 outputs the comparison signal Q1 by comparing the first data signal DS1 with the first reference voltage VH.

Conversely, when the value C11-0 corresponds to the low level, in FIG. 6, the NMOS transistor MN10 is turned on and the NMOS transistors MN6 and MN8 are turned off. In this case, the comparing circuit 211 outputs the comparison signal Q1 by comparing the first data signal DS1 with the second reference voltage VL.

At this time, the level of the comparison signal Q1 is indicated as C11-1, which indicates whether the value D11 of the first data signal DS1 was above the first reference voltage VH when C11-0 is 1, and indicates whether the value D11 of the first data signal DS1 was above the second reference voltage VL when C11-0 is 0.

The flip-flop 212 shifts and outputs the comparison signal Q1 by one period of the first comparing clock signal CCK0, and the flip-flop 213 shifts and outputs an output of the flip-flop 212 by one period of the first comparing clock signal CCK0.

As such, the first level detecting subcircuit 210 outputs a level of the first data signal DS1 corresponding to the first phase as the first state signal ST01 and ST11 when the input signal is sampled by the four-phase clock signal.

For example, at T4, C11-0 and C11-1 corresponding to the first state signal ST01 and ST11 are output.

The second, third, and fourth level detecting subcircuits 220, 230, and 240 determine levels of corresponding data among the second, third, and fourth data signals DS2, DS3, and DS4 and output the second, third, and fourth state signals ST02 and ST12, ST03 and ST13, and ST04 and ST14, respectively, in the manner described for the first level detecting subcircuit 210.

Figure 8:
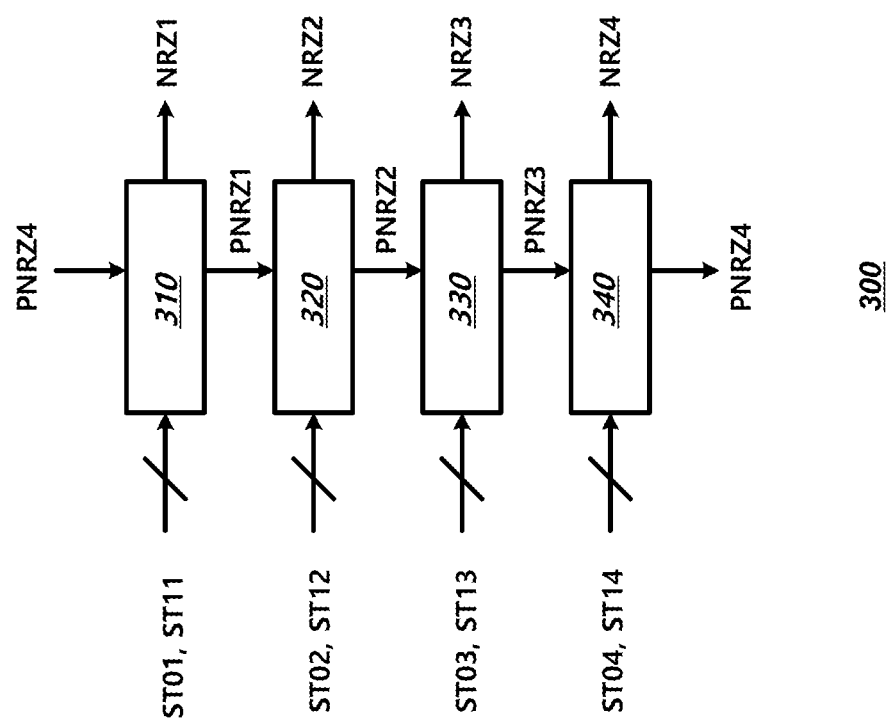
FIG. 8 illustrates a data converting circuit according to an embodiment of the present disclosure.

FIG. 8 is a block diagram illustrating the data converting circuit 300.

The data converting circuit 300 includes a first data converting subcircuit 310, a second data converting subcircuit 320, a third data converting subcircuit 330, and a fourth data converting subcircuit 340.

The first data converting subcircuit 310, the second data converting subcircuit 320, the third data converting subcircuit 330, and the fourth data converting subcircuit 340 operates in synchronization with the first to fourth clock signals CK0, CK90, CK180, and CK270, respectively.

The first data converting subcircuit 310 outputs a first bit NRZ1 and a first past bit PNRZ1 with reference to the first state signals ST01 and ST11 and the fourth past bit PNRZ4.

The fourth past bit PNRZ4 is a bit corresponding to a phase immediately preceding a phase corresponding to the first bit NRZ1.

FIG. 9 is a table for explaining an operation of the first data converting subcircuit 310.

When the first state signal ST01 and ST11 are both 0, indicating that the first data signal DS1 had a voltage value less than the second reference voltage VL, it corresponds to level 0 of the duobinary signal, and in level 0, the current bit is determined to be 0 regardless of the previous bit.

When the first state signal ST01 and ST11 are both 1, indicating that the first data signal DS1 had a voltage value greater than the first reference voltage VH, it corresponds to level 2, and in level 2, the current bit is determined to be 1 regardless of the previous bit.

When only one of the first state signal ST01 and ST11 is 1, indicating that the first data signal DS1 had a voltage value between the second reference voltage VL and the first reference voltage VH, it corresponds to level 1. In level 1, when the previous bit is 0, the current bit must be 1, and when the previous bit is 1, the current bit must be 0.

Accordingly, in level 1, the first bit NRZ1 corresponds to a value obtained by inverting the previous bit, which is the fourth past bit PNRZ4.

Operations of the second data converting subcircuit 320 to the fourth data converting subcircuit 340 are substantially the same as those of the first data converting subcircuit 310, and thus a repetitive description will be omitted.

Figure 10:
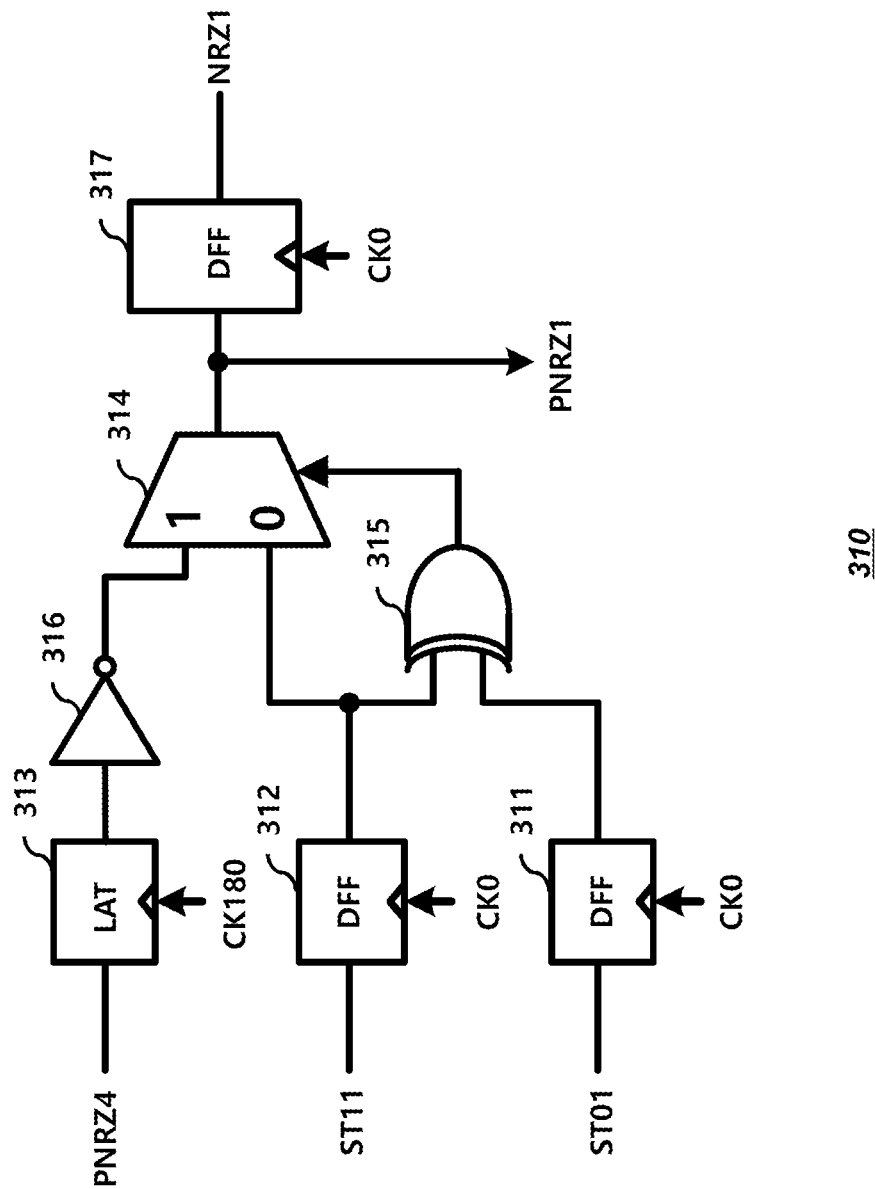
FIG. 10 illustrates the first data converting subcircuit according to an embodiment of the present disclosure.

FIG. 10 is a circuit diagram illustrating the first data converting subcircuit 310.

The first data converting subcircuit 310 includes flip-flops 311 and 312 that latch the first state signal ST01 and ST11 in synchronization with the first clock signal CK0, and a latch 313 that latches the fourth past bit PNRZ4 in synchronization with the third clock signal CK180.

The latch 313 outputs the fourth past bit PNRZ4 in the period in which the third clock signal CK180 is at the high level, and maintains the existing output value in the period in which the third clock signal CK180 is in the low level.

The first data converting subcircuit 310 outputs the first state signal's most significant bit ST11 when the first state signal ST01 and ST11 are both 0 or both 1, and inverts and outputs an output of the latch 313 when only one of the first state signal ST01 and ST11 is 1.

The first data converting subcircuit 310 includes an XOR gate 315 that performs an XOR operation on the outputs of the flip-flops 311 and 312, and an output of the XOR gate 315 is provided as a selection signal of the selection circuit 314.

The first data converting subcircuit 310 further includes an inverter 316 that inverts an output of the latch 313 and provides it to the selection circuit 314.

The first data converting subcircuit 310 further includes a flip-flop 317 that latches an output of the selection circuit 314 according to the first clock signal CK0 to output the first bit NRZ1.

The selection circuit 314 outputs the first past bit PNRZ1.

The configurations of the second to fourth data converting subcircuit 320 to 340 are substantially the same as that of the first data converting subcircuit 310, and thus detailed descriptions thereof will be omitted in the interest of brevity.

Returning to FIG. 2, the serializing circuit 400 receives the first to fourth bits NRZ1 to NRZ4 received in parallel from the data converting circuit 300 and converts them into a serial signal.

Since the design of the serializing circuit 400 can be easily known from a well-known technique in the related arts, a detailed description thereof will be omitted.

As described above, in the present embodiment, one comparing circuit 211 from among the level detecting subcircuits 210 through 240 of the level detecting circuit 200 is coupled to the analog receiving circuit 10 at a specific time by the operation of the signal dividing circuit 100 to reduce the load.

This embodiment assumes that a duobinary signal encoded according to a four-phase clock signal is received, but is not limited thereto.

For example, additional level detecting subcircuits may be added in the level detecting circuit 200 and additional data converting subcircuits may be added in the data converting circuit 300 to accommodate an additional number of phases.

Although various embodiments have been illustrated and described, various changes and modifications may be made to the described embodiments without departing from the spirit and scope of the invention as defined by the following claims.

What is claimed is:

1. A duobinary receiver comprising:
   a signal dividing circuit configured to output a plurality of data by dividing an input signal according to a plurality of multi-phase sampling clocks signals;
   a level detecting circuit configured to output a plurality of state signals respectively corresponding to duobinary levels of the plurality of data; and
   a data converting circuit configured to decode the plurality of state signals to output a corresponding plurality of bits,
   wherein the level detecting circuit includes a first level detecting subcircuit configured to detect a duobinary level of a first data among the plurality of data and to output a first state signal among the plurality of state signals, the first level detecting subcircuit including:
      a comparing circuit configured to compare the first data with a reference voltage; and
      a reference voltage selecting circuit configured to control the comparing circuit so that the reference voltage is changed according to an output of the comparing circuit, and
   wherein the reference voltage selecting circuit controls the comparing circuit so that an intermediate voltage corresponding to an average of a first power supply voltage and a second power supply voltage be selected as the reference voltage and the comparing circuit outputs a most significant bit of the first state signal by comparing the first data with the intermediate voltage.

2. The duobinary receiver of claim 1, further comprising a serializing circuit configured to serialize the plurality of bits.

3. The duobinary receiver of claim 1, wherein the signal dividing circuit includes a plurality of switches respectively controlled by the plurality of multi-phase sampling clock signals, and wherein the plurality of switches provides the input signal as the plurality of data.

4. The duobinary receiver of claim 1, wherein the reference voltage selection circuit controls the comparing circuit so that a first reference voltage greater that the intermediate voltage or a second reference voltage smaller than the intermediate voltage is selected as the reference voltage according to the most significant bit of the first state signal and the comparing circuit outputs a least significant bit of the first state signal by comparing the first data with the selected reference voltage.

5. The duobinary receiver of claim 4, further comprising flip-flops that latch the most significant bit and the least significant bit.

6. The duobinary receiver of claim 5, wherein the first level detecting circuit operates according to a first comparing clock signal having shorter period than that of the plurality of multi-phase sampling clock signals.

7. The duobinary receiver of claim 1, wherein the level detecting circuit further includes an N-th level detecting subcircuit that detects a duobinary level of an N-th data corresponding to a last phase of the plurality of data and outputs an N-th state signal among the plurality of state signals, wherein N is a natural number greater than 1.

8. The duobinary receiver of claim 7, wherein the data converting circuit includes:
   a first data converting subcircuit configured to output a first bit among the plurality of bits and a first past bit corresponding to a past value of the first bit; and
   an N-th data converting subcircuit configured to output an N-th bit among the plurality of bits and an N-th past bit corresponding to a past value of the N-th bit,
   wherein the first data converting subcircuit determines the first bit corresponding to the first data according to the first state signal and the N-th past bit.

9. The duobinary receiver of claim 8, wherein the first state signal includes most and least significant bits corresponding to a duobinary level of the first data, wherein the first data converting subcircuit determines the N-th past bit as the first bit when the most significant bit is different from the least significant bit, and wherein the first data converting subcircuit determines the most significant bit or the least significant bit as the first bit when the most significant bit and the least significant bit are equal.

10. The duobinary receiver of claim 1, further comprising a control signal generating circuit configured to generate the plurality of multi-phase clock signals according to a plurality of multi-phase input clock signals.

\* \* \* \* \*